United States Patent
Lazarescu et al.

(10) Patent No.: US 6,927,643 B2
(45) Date of Patent: Aug. 9, 2005

(54) OSCILLATOR TOPOLOGY FOR VERY LOW PHASE NOISE OPERATION

(75) Inventors: Raducu Lazarescu, San Diego, CA (US); Carl R. C. De Ranter, San Diego, CA (US); Bert L. Fransis, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 113 days.

(21) Appl. No.: 10/605,635

(22) Filed: Oct. 15, 2003

(65) Prior Publication Data

US 2004/0108908 A1 Jun. 10, 2004

Related U.S. Application Data

(60) Provisional application No. 60/319,630, filed on Oct. 18, 2002.

(51) Int. Cl.$^7$ .............................. H03B 5/04; H03B 5/12
(52) U.S. Cl. ............. 331/186; 331/117 R; 331/117 FE; 331/175; 331/176; 331/177 V
(58) Field of Search ........................... 331/36 C, 117 R, 331/117 FE, 117 D, 175, 176, 177 V, 185, 186

(56) References Cited

U.S. PATENT DOCUMENTS

| | | | |
|---|---|---|---|
| 6,229,406 B1 * | 5/2001 | Wang | .................. 331/117 FE |
| 2002/0060612 A1 | 5/2002 | Traub | |

OTHER PUBLICATIONS

Zannoth, M. et. al., "A Single–Chip SI Bipolar 1.6 GHz VCO with Integrated–Bias Network," IEEE Trans. MTT (NY), vol. 48, No. 2, Feb. 2000, pps. 203–205.

Li, H. et. al., "47 GHz VCO with Low Phase Noise Fabricated in a SiGe Bipolar Production Technology," IEEE Microw. and Wireless Cmpnt. Ltrs, vol. 12, No. 3 Mar. 2002, pps 79–81.

Deranter, C. et. al. "High Data Rate Transmitter Circuits: RF CMOS Design and Techniques for Design Automation," Kluwer Academic Publishers, ISBN 1402075456, pgs. 177–179; undated.

Ismail, A et al. "CMOS Differential LC Oscillator with Suppressed Up–Converted Flicker Noise," IEEE Int'l Solid–State Circuits Conf., Sep. 2003; 8 pages.

* cited by examiner

*Primary Examiner*—David Mis
(74) *Attorney, Agent, or Firm*—Clifford B. Perry

(57) ABSTRACT

An oscillator circuit includes a tank circuit, first and second oscillator transistors, and a gain-cell tuning inductor. The tank circuit includes first and second ports, and is configured to resonate at one or more predefined frequencies. The first oscillator transistor includes first port, a second port coupled to the first port of the tank circuit, and a third port. The second oscillator transistor includes a first port, a second port coupled to the second port of the tank circuit, and a third port. The gain-cell tuning inductor is coupled between the third ports of the first and second oscillator transistors and is operable to conduct a biasing signal supplied thereto to the third ports of the first and second oscillator transistors.

17 Claims, 1 Drawing Sheet

OSCILLATOR TOPOLOGY FOR VERY LOW PHASE NOISE OPERATION

CROSS REFERENCE TO RELATED APPLICATIONS

This application claims the benefit of U.S. Provisional Application No. 60/319,630, filed Oct. 18, 2002, the contents of which are herein incorporated by reference in its entirety for all purposes.

BACKGROUND OF INVENTION

The present invention relates in general to electronic circuits, and more particularly to low noise oscillators circuits.

Oscillator circuits are well known in the art, and may be generally described as circuits which generate an output signal, the frequency of which is determined by a connecting "tank" or resonant circuit. Oscillator circuits (including voltage controlled oscillators or VCOs) are important circuits in today's electronics as they form the crucial building blocks in larger circuits such as frequency synthesizers, modulators and demodulators, and clock recovery circuits typically employed in numerous telecommunication products.

In many instances, the performance of these telecommunications devices is limited by the oscillator's "phase noise," which can be generally described as the random variation in the phase or frequency of the output signal. In essence, the oscillator phase noise places a limit on how precisely the output frequency of the oscillator can be generated. This loss in accuracy translates into errors in the transmission and reception of information. What is therefore needed is an oscillator circuit which exhibits improved phase noise performance.

SUMMARY OF INVENTION

The present invention describes a new architecture for a very low noise oscillator circuit. The phase noise performance of the present design is improved by the use of various features. In a first embodiment of the present invention, an improved oscillator circuit is presented which includes a tank circuit, first and second oscillator transistors (together forming the gain-cell providing the negative impedance to compensate losses in the tank circuit and thus ensuring oscillation), and a gain-cell tuning inductor. The tank circuit includes first and second ports, and is configured to resonate at one or more predefined frequencies. The first oscillator transistor includes a first port, a second port coupled to the first port of the tank circuit, and a third port. The second oscillator transistor includes a first port, a second port coupled to the second port of the tank circuit, and a third port. The gain-cell tuning inductor is coupled between the third ports of the first and second oscillator transistors, and is operable to conduct a biasing signal supplied thereto to the third ports of the first and second oscillator transistors.

In a second embodiment of the present invention, an integrated oscillator circuit is presented which includes a tank circuit, first and second oscillator transistors, a bias supply circuit, and a gain-cell tuning inductor. The tank circuit includes first and second ports, and is configured to resonate at one or more predefined frequencies. The first oscillator transistor includes a first port, a second port coupled to the first port of the tank circuit, and a third port. The second oscillator transistor includes a first port, a second port coupled to the second port of the tank circuit, and a third port. The bias supply circuit operates to generate a biasing signal. The gain-cell tuning inductor is coupled to the bias supply circuit and between the third ports of the first and second oscillator transistors and is operable to conduct the biasing signal to the third ports of the first and second oscillator transistors.

Other aspects and advantages of the invention will become apparent when referring to the description and drawings described herein.

DETAILED DESCRIPTION

Figure 1:
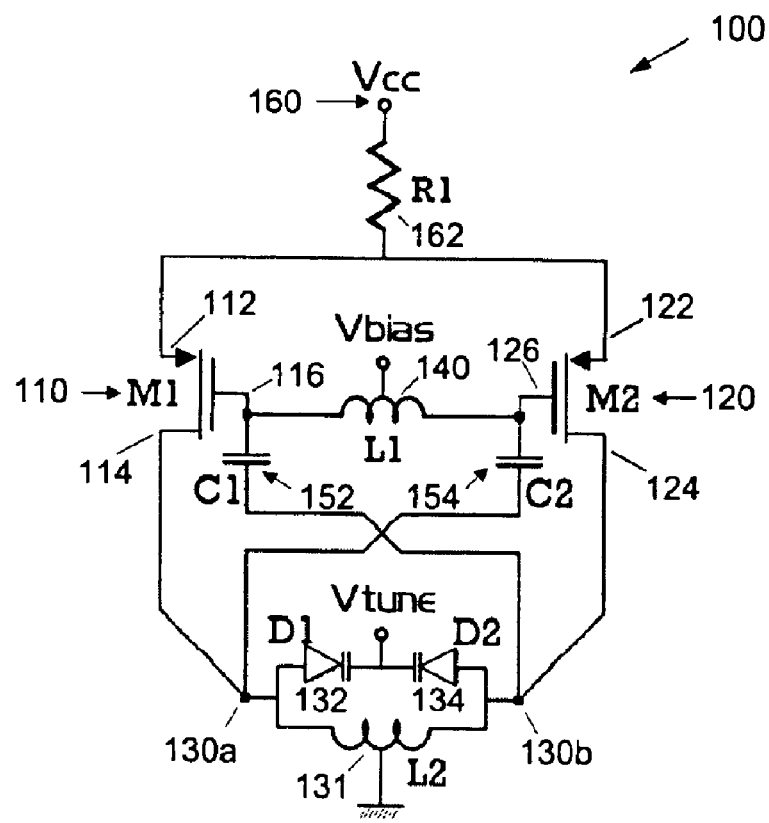
FIG. 1 illustrates a low noise oscillator circuit in accordance with one embodiment of the present invention.

FIG. 1 illustrates an oscillator circuit 100 in accordance with one embodiment of the present invention. The oscillator circuit 100 includes oscillator transistors 110 and 120 arranged in a differential configuration, a tank circuit 130, a gain-cell tuning inductor 140, capacitors 152 and 154, and a supply resistor 162. In one embodiment, each of these components are monolithically fabricated in a complementary metal oxide semiconductor (CMOS) process, although those of skill in the art will appreciate that the circuit may be formed in other materials (e.g., GaAs), as well as in monolithic, hybrid, or discrete form.

Oscillator transistors 110 and 120 provide negative resistance to compensate for the losses of the tank circuit 130, thereby allowing the circuit 100 to oscillate. Oscillator transistors 110 and 120, in one embodiment, are p-type metal oxide semiconductor (pMOS) transistors having their respective source terminals 112 and 122 coupled together and to the power supply 160 through supply resistor 162. Drain terminals 114 and 124 are coupled to the first and second ports of the tank circuit 130a and 130b, respectively. Gate terminals 116 and 126 are coupled to a gain-cell tuning inductor 140, through which a biasing signal $V_{bias}$ is supplied. While oscillator transistors 110 and 120 are illustrated as pMOS transistors, other FET transistor embodiments such as nMOS, as well as bipolar transistor architectures may be used in alternative embodiments under the present invention.

During operation, the tank circuit 130 is coupled to a first potential (a ground potential in the illustrated embodiment) and includes two ports 130a and 130b connected between the drain and gate terminals of the oscillator transistors 110 and 120. The oscillator transistors 110 and 120 are coupled to a second potential (Vcc in the illustrated embodiment) via their respective first ports 112 and 122. The resonant frequency is defined in the illustrated embodiment by the combined reactance of a tank inductor 131 connected in parallel with a capacitor, realized in one embodiment as two series-coupled, reverse-biased varactor diodes 132 and 134. The capacitor may alternatively be realized as a MOS capacitor. A tuning voltage $V_{tune}$ is supplied to the varactor diodes 132 and 134 to set the capacitance of the tank circuit, thereby setting the resonant frequency of the oscillator 100. While the illustrated embodiment illustrates a variable reactance tank circuit commonly used in voltage controlled oscillator circuits (VCOs), the invention is not limited thereto, and a tank circuit having a fixed resonant frequency may be used in an alternative embodiment of the invention.

Moreover, the invention is not limited to any particular tank circuit configuration, as any resonant circuit, active or passive, parallel or series-coupled, can be used with the present invention. In embodiments in which n-type FETs or BJTs (bipolar junction transistors) are employed, the first and second potentials are reversed, e.g., tank inductor 131 is coupled to a power supply, the polarity of the varactor diodes 132 and 134 are reversed, and the power supply 160 is replaced with a ground connection. Further, those skilled in the art will appreciate that the aforementioned first and second potentials may be any value and polarity sufficient to bias the oscillator transistors 110 and 120 at the desired operating point.

The gain-cell tuning inductor 140 is coupled between the gate terminals of oscillator transistors 110 and 120. The gain-cell tuning inductor 140 is preferred over the conventional employed, and thermal noise-generating resistor. The gain-cell tuning inductor 140 operates to increase the open-loop gain of the VCO generating the negative impedance, with a minimal addition of thermal noise in the loop. The gain is increased due to resonance occurring between the gain-cell output ports connected to the main resonant tank of the VCO (in this embodiment the one connected to ground) and the input ports of the gain-cell (in this embodiment the gates of the transistors that are capacitively coupled to the resonant tank). As those skilled in the art will recognize, the increased gain results in a higher signal amplitude at the gate terminals of transistors 110 and 120, which in turn leads to a higher signal-to-noise ratio at the gate terminals, a higher transistor switching efficiency, and consequently lower phase noise. The coupling capacitors 152 and 154 additionally operate to DC isolate the transistor gate terminals 116 and 126 from the tank circuit. This permits the use of transistors with larger device sizes resulting in a lower 1/f-noise in the oscillator transistors 110 and 120, again leading to a reduction in oscillator phase noise. To even further reduce oscillator phase noise, the supply resistor 162 is used as a current limiter instead of conventionally used active current source, as the latter can provide excess 1/f and white noise.

Figure 2:
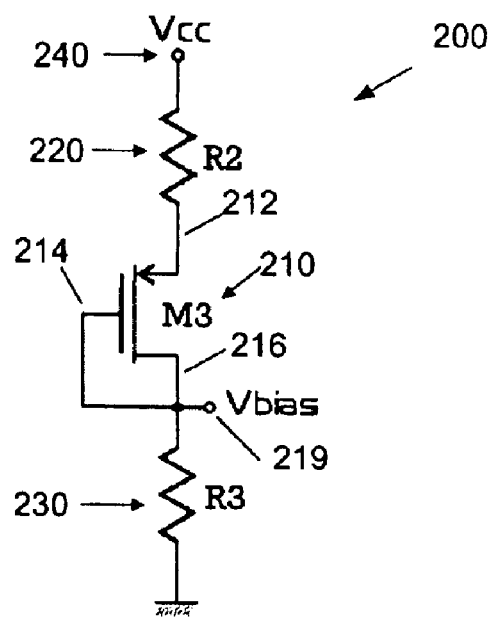
FIG. 2 illustrates one embodiment of a low noise bias supply circuit operable to generate a biasing signal to the oscillator circuit shown in FIG. 1 in accordance with the present invention.

FIG. 2 illustrates a low noise bias supply circuit 200 operable to generate the biasing signal $V_{bias}$ in accordance with one embodiment of the present invention. The bias supply circuit 200 includes a bias transistor 210, a first bias circuit resistor 220 coupled to a power supply 240, and a second bias circuit resistor 230 coupled to ground. The bias transistor 210 has a source terminal 212 connected to a first bias circuit resistor 220, and gate and drain terminals 214 and 216 coupled together at node 219 in a diode configuration, producing the biasing signal $V_{bias}$ at node 219. This signal is coupled to the biasing inductors 140, which in turn supplies the signal to the gate terminals of oscillator transistors 110 and 120.

In a specific embodiment of oscillator 100, first and second oscillator transistors 110 and 120 are (200 um/0.35 u) pMOS transistors. The biasing inductor 140 is 2.0 nH, and preferably has a Q of 10 or higher. The $V_{CC}$ supply 160 operates at +2.7 to +3.6 VDC and the supply resistor 162 is 50 ohms. Coupling capacitors 152 and 154 are 2 pF, and the tank inductor 131 is 1.2 nH. The varactor diodes 132 and 134 exhibit 3.2 pF to 1.6 pF capacitance as $V_{tune}$ ranges from +0.5 VDC to +3 VDC. Those skilled in the art will appreciate that the aforementioned device parameters are only exemplary, and other values may be used. For example, even larger oscillator transistors may be selected to operate at a lower 1/f noise level, albeit with increased parasitic capacitance. In such an instance, the value of the bias inductor 140 and coupling capacitors 152 and 154 would be modified to match out the increase parasitic capacitance of the larger oscillator transistors 110 and 120.

In a specific embodiment of the biasing circuit 200, the bias transistor 210 is a (1250 um/2 u) pMOS transistor, the $V_{CC}$ supply 240 operates between +2.7 to +3.6 VDC, and bias resistors 220 and 230 are 200 ohms and 300 ohms respectively. As noted above, these values are only exemplary, and others may be used in alternative embodiments under the present invention.

In an integrated oscillator circuit comprising the oscillator circuit 100 of FIG. 1 and the bias supply circuit 200 of FIG. 2, the operation of the integrated assembly remains relatively constant over process and temperature variation as the electrical parameters of each circuit tracks the other. Specifically, as temperature and process changes occur, the resistance values of resistors R1, R2 and R3, will move in the same direction and substantially the same amount relative to their size and scale. Also, the transistor parameters of M1, M2 and M3 will move in the same direction and substantially the same amount relative to their size and scale. Accordingly, although the electrical parameters of resistivity, threshold voltage, etc. may change with process and temperature, the components will track each other resulting in substantially the same circuit performance over these changes.

While the above is a detail description of the present invention, it is only exemplary and various modifications, alterations and equivalents may be employed in various apparati and processes described herein. Accordingly, the scope of the present invention is hereby defined by the metes and bounds of the following claims.

What is claimed is:

1. An oscillator circuit, which comprises:
   a tank circuit having a first port and a second port, the tank circuit configured to resonate at one or more predefined frequencies;
   a first oscillator transistor having a first port, a second port coupled to the first port of the tank circuit, and a third port;
   a second oscillator transistor having a first port, a second port coupled to the second port of the tank circuit, and a third port;
   a gain-cell tuning inductor coupled between the third ports of the first and second oscillator transistors:
   a first capacitor coupled between the third port of the first oscillator transistor and the second port of the tank circuit; and
   a second capacitor coupled between the third port of the second oscillator transistor and the first port of the tank circuit,
   wherein the gain-cell tuning inductor is operable to conduct a bias signal supplied thereto to the third ports of the first and second oscillator transistors.

2. The oscillator circuit of claim 1, further comprising a supply resistor having a first port coupled to the first ports of the first and second oscillator transistors.

3. The oscillator circuit of claim 1, wherein the tank circuit comprises:
   first and second varactor diodes coupled in series and between the first and second ports of the tank circuit; and
   a tank inductor coupled between the first and second ports of the tank circuit.

4. The oscillator circuit of claim 1, wherein the tank inductor is coupled to first potential, and the first ports of first and second oscillator transistors coupled to a second potential.

5. The oscillator circuit of claim 4, wherein the first and second oscillator transistors comprise PMOS FET transistors or p-type bipolar transistors.

6. The oscillator circuit of claim 5, wherein the first potential is ground potential and the second potential ranges from +2.7 to +3.6 VDC.

7. The oscillator circuit of claim 4, wherein the first and second oscillator transistors comprise NMOS FET transistors or n-type bipolar transistors.

8. The oscillator circuit of claim 7, wherein the first potential ranges from +2.7 to +3.6 VDC, and the second potential is ground potential.

9. An integrated oscillator circuit, which comprises:
   a tank circuit having a first port and a second port, the tank circuit configured to resonate at one or more predefined frequencies;
   a first oscillator transistor having a first port, a second port coupled to he first port of the tank circuit, and a third port;
   a second oscillator transistor having a first port, a second port coupled to the second port of the tank circuit, and a third port;
   a first capacitor coupled between the third port of the first oscillator transistor and the second port of the tank circuit;
   a second capacitor coupled between the third port of the second oscillator transistor and the first port of the tank circuit; and
   a bias supply circuit configured to generate a biasing signal, comprising:
      a bias transistor having a first port, a second port, and a third port, wherein the second and third ports are coupled together;
      a first bias circuit resistor coupled to the first port of the bias transistor;
      a second bias circuit resistor coupled to the second port of the bias transistor; and
      a gain-cell tuning inductor coupled between the third ports of the first and second oscillator transistors, and coupled to the second port of the bias transistor to receive the biasing signal,
   wherein the gain-cell tuning inductor is operable to conduct the bias signal to the third ports of the first and second oscillator transistors.

10. The integrated oscillator circuit of claim 9, further comprising a supply resistor having a first port coupled to the first ports of the first and second oscillator transistors.

11. The integrated oscillator circuit of claim 9, wherein the tank circuit comprises:
   first and second varactor diodes coupled in series and between the first and second ports of the tank circuit; and
   a tank inductor coupled between the first and second ports of the tank circuit.

12. The oscillator circuit of claim 9, wherein the second bias circuit resistor and the tank inductor are coupled to first potential, and the first bias circuit resistor and the first ports of first and second oscillator transistors are coupled to a second potential.

13. The oscillator circuit of claim 12, wherein the first and second oscillator transistors comprise PMOS FET transistors or p-type bipolar transistors.

14. The oscillator circuit of claim 13, wherein the first potential is ground potential and the second potential ranges from +2.7 to +3.6 VDC.

15. The oscillator circuit of claim 12, wherein the first and second oscillator transistors comprise NMOS FET transistors or n-type bipolar transistors.

16. The oscillator circuit of claim 15, wherein the first potential ranges from +2.7 to +3.6 VDC, and the second potential is ground potential.

17. An oscillator circuit comprising:
   tank circuit means for resonating at one or more predefined frequencies, the tank circuit means having a first port and a second port;
   gain cell means for providing negative impedance to compensate losses in the tank circuit; the gain cell means comprising:
      a first oscillator transistor having a first port, a second port coupled to the first port of the tank circuit, and a third port;
      a second oscillator transistor having a first port, a second port coupled to the second port of the tank circuit, and a third port; and
      gain-cell tuning means for increasing the open-loop gain of the gain cell means, the gain cell tuning means coupled between the third ports of the first and second oscillator transistors,
   a first capacitor coupled between the third port of the first oscillator transistor and the second port of the tank circuit; and
   a second capacitor coupled between the third port of the second oscillator transistor and the first port of the tank circuit,
   wherein the gain-cell tuning means is operable to conduct the bias signal to the third ports of the first and second oscillator transistors.

* * * * *